United States Patent [19]

Yamamoto et al.

[11] Patent Number: 4,565,928
[45] Date of Patent: Jan. 21, 1986

[54] PHOTO ELECTRO TRANSDUCER DEVICE

[75] Inventors: Hideaki Yamamoto, Tokorozawa; Toru Baji, Kokubunji; Toshihisa Tsukada; Akira Sasano, both of Tokyo, all of Japan

[73] Assignees: Nippon Telegraph & Telephone Public Corp.; Hitachi, Ltd., both of Tokyo, Japan

[21] Appl. No.: 421,403

[22] Filed: Sep. 22, 1982

[30] Foreign Application Priority Data

Sep. 30, 1981 [JP] Japan .............................. 56-153724

[51] Int. Cl.$^4$ ............................................. H01J 40/14
[52] U.S. Cl. .................................... 250/578; 358/213
[58] Field of Search ........................... 250/211 J, 578; 358/212, 213; 357/31, 32, 2

[56] References Cited

U.S. PATENT DOCUMENTS

| 4,166,919 | 9/1979 | Carlson | 357/2 |
| 4,369,372 | 1/1983 | Yoshioka et al. | 250/578 |
| 4,408,230 | 10/1983 | Tamura et al. | 250/578 |
| 4,499,384 | 2/1985 | Segawa et al. | 250/578 |

FOREIGN PATENT DOCUMENTS 2103049 6/1981 United Kingdom .............. 358/212

OTHER PUBLICATIONS

P.W. Fry, Silicon Photodiode Arrays 1975.

Primary Examiner—David C. Nelms
Assistant Examiner—J. Gatto
Attorney, Agent, or Firm—Antonelli, Terry & Wands

[57] ABSTRACT

A photosensor comprises a first conductive layer formed on a given substrate, a one-dimensional array of a plurality of unit picture elements formed on the first conductive layer to extend in the longitudinal direction thereof, each unit picture element having a photodiode and a blocking diode connected in series with the photodiode in a relationship of reversed rectifying direction therewith, a second conductive layer for connecting together, at one end, respective unit picture elements belonging to each of at least two unit picture element groups having each at least two of adjacent unit picture elements, and a third conductive layer for connecting together, at the other end, corresponding unit picture elements in the respective groups, the set of the photodiode and blocking diode in the respective groups being made of the same semiconductor material. Dispersion of outputs from the respective unit picture elements can be minimized.

16 Claims, 18 Drawing Figures

FIG. Ia
PRIOR ART
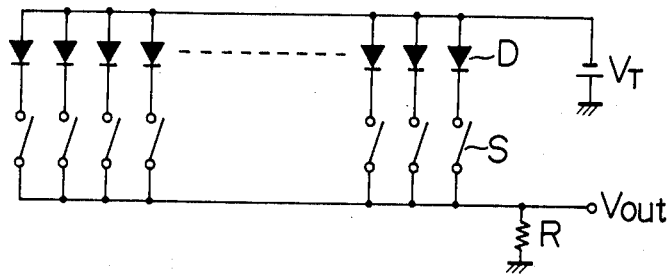
FIG. Ib
PRIOR ART
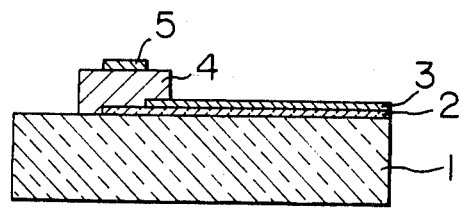
FIG. 2a
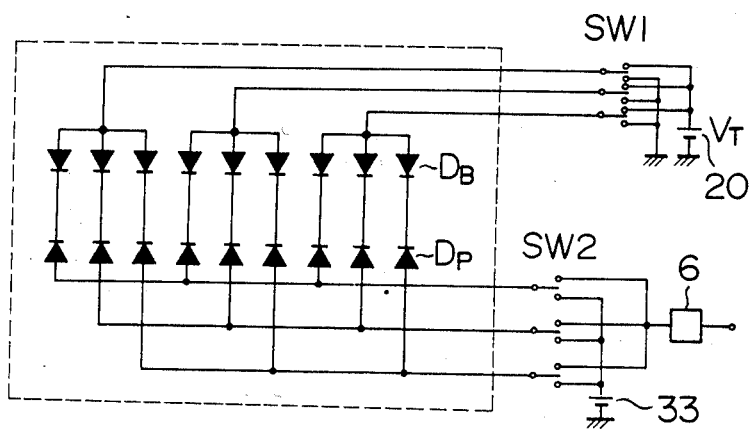
FIG. 2b
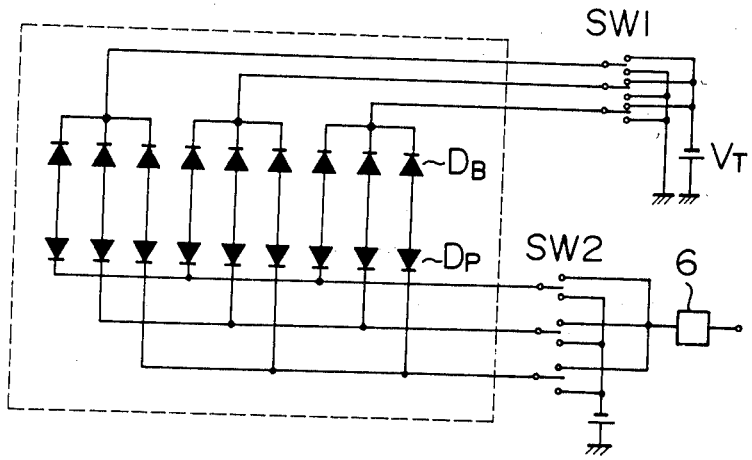

PHOTO ELECTRO TRANSDUCER DEVICE

This invention relates to a photosensor especially suitable for use in facsimile equipment, optical character recognition devices or the like.

There is presently available a contact type photosensor for a facsimile transmitter wherein an original from which information is read is in close contact with a photosensor. With a contact type linear image sensor, the original is not required to be reduced in scale and accordingly, an optical path for the purpose of scale reduction is not needed.

Typical examples of this type of photosensor are disclosed in, for example, U.S. Pat. Nos. 4,227,078 and 4,233,506.

A prior art photosensor used in this field of application has a circuit construction as shown in FIG. 1a and a sectional structure as shown in FIG. 1b. Illustrated in FIG. 1a are a one-dimensional or linear array of photodiodes D typically comprising several hundreds or even several thousand arranged photodiodes, a group of switches S adapted to select the photodiodes, a power source $V_T$ fed to the photodiodes, a load resistor R, and an output signal terminal $V_{out}$.

In order to read the information without resort to a conventional optical lens or with a focussing rod lens array, for example, SELFOC LENS (trade mark) manufactured by Nippon Itagarasu, the full length of the array in the photosensor must be longer than the paper width of the information original (for example, 210 mm in the case of an original of A4 size). Accordingly, the photosensor is required to be considerably elongated and is difficult to construct in the form of an ordinary silicon untegrated circuit. Therefore, the prior art photosensor has a structure as shown in sectional form in FIG. 1b which is comprised of a glass (inclusive of fiber plate) substrate 1, a transparent conductive film 2 of $SnO_2$, a metal film 3, a semiconductor film 4, and a metal film 5. In particular, a portion sandwiched by the transparent conductive film 2 and the metal film 5 is used as a photodiode. For more details, one may refer to Japanese laid-open patent publication No. 54-2621, for example.

Disadvantageously, in such a prior art photosensor, a number of switches S amounting to the number of photodiodes D are required, and highly involved techniques and considerable labor time are required for connecting the photodiodes and the switches, thus raising cost and degrading yielding rate.

An object of this invention is to provide an inexpensive and easy-to-handle photosensor wherein photodiodes are driven on the basis of a matrix drive scheme to minimize the number of switches necessary for selection of the photodiodes.

According to this invention, there is provided a photosensor comprising a first conductive layer formed on a given substrate, a one-dimensional array of a plurality of unit picture elements formed on the first conductive layer to extend in the longitudinal direction thereof, each unit picture element having a photodiode and a blocking diode connected in series with the photodiode in a relationship of reversed rectifying direction therewith, a second conductive layer for connecting together, at one end, respective unit picture elements belonging to each of at least two unit picture element groups having each at least two of adjacent unit picture elements, and a third conductive layer for connecting together, at the other end, corresponding unit picture elements in the respective groups, the set of the photodiode and blocking diode being made of the same semiconductor film.

The present invention will be apparent from the following detailed description taken in conjunction with the accompanying drawings, in which:

FIG. 1a shows an equivalent circuit configuration of a prior art photosensor;

FIG. 1b is a sectional view of the photosensor;

FIG. 2a shows an equivalent circuit configuration of a photosensor embodying the invention;

FIG. 2b shows an equivalent circuit configuration of another photosensor embodying the invention;

FIGS. 3a to 3e show equivalent circuit diagrams useful in explaining the drive operation of the photosensor of FIG. 2a;

FIG. 4b is a sectional view of FIG. 4a; and

FIGS. 5a to 10 are sectional views showing further embodiments of the photosensor according to the invention.

A photosensor of the present invention is driven in a matrix drive scheme and its equivalent circuit configurations are exemplified in FIGS. 2a and 2b in which a 3×3 matrix array is taken for simplicity of explanation. However, a matrix array actually used is typically of the order of 32×54. Illustrated in FIGS. 2a and 2b are an array of photodiodes Dp, an array of diodes $D_B$ called blocking diodes, a power source $V_T$ feeding these photodiodes and blocking diodes, a group of switches $SW_1$ for selection of rows of the matrix, a group of switches $SW_2$ for selection of columns of the matrix, and a read circuit 6.

Figure 3A:
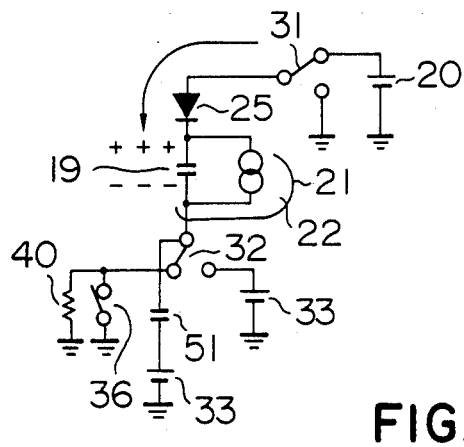
Figure 3B:
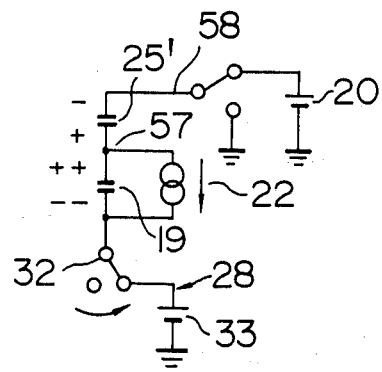
Figure 3C:
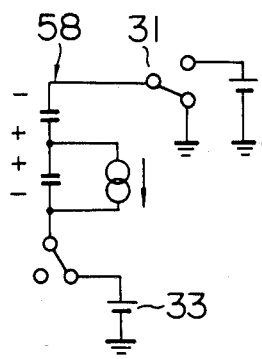
Figure 3D:
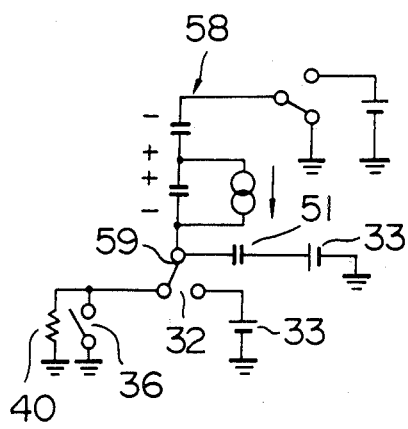
Figure 3E:
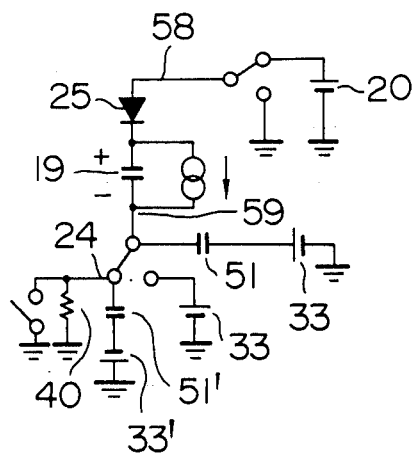
Figure 3F:
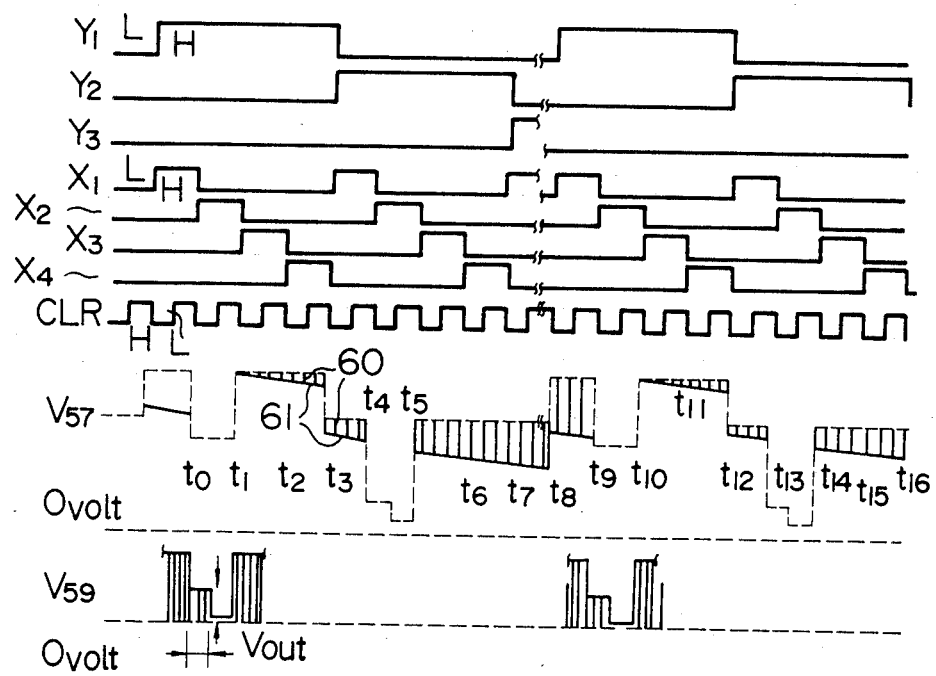
FIG. 3f is a timing chart in driving the FIG. 2a photosensor.

The operational principle of the exemplary matrix of the FIG. 2a will now be described by way of equivalent circuits as shown in FIGS. 3a to 3e and a timing chart as shown in FIG. 3f. In the equivalent circuits, the blocking diode $D_B$, photodiodes $D_P$ and power source $V_T$ shown in FIG. 2a are designated by reference numerals 25, 21 and 20, respectively. With reference to FIG. 3a, when one end of the diode 25 is connected to a bias voltage of the power source 20 and a capacitor 19 having one end connected to the other end of the diode 25 is grounded, at the other end, via a switch 36 or a resistor 40, the diode 25 is forward-biased and thus rendered conductive so that the capacitor 19 associated with the photodiode 21 is charged with bias voltage 20. Thereafter, when a switch 32 is transferred to a power source 33 (FIG. 3b), the diode 25 is reverse-biased to cut off current flowing therethrough and it acts as an equivalent capacitor 25'. Under this condition, a (node) 57 between capacitors 25' and 19 is isolated from the neighbouring circuits with only exception of its communication with a photocurrent source 22. Consequently, electric charge at this (node) is discharged through the photocurrent source 22 which depends on photo-signals, thereby ensuring that electric charge in proportion to the photo-signals and photosignal charge is stored at the node. During storage of the photo-signal charge, in order to read the signal of the other picture elements, a switch 31 is transferred for grounding a point 58 on a row conductor as shown in FIG. 3c or while keeping the point 58 grounded, the switch 32 is transferred for connecting a point 59 to either a load capacitor 51 or the load resistor 40. In any case, it is necessary to cut off the diode 25 while the switches 31 and 32 are kept transferred, in order to maintain storage of the photo-signal charge at the node 57 and prevent cross talk between the picture element of interest and the other picture elements. During such a period, the diode is most liable to be brought into conduction under a state as shown in FIG. 3b which immediately precedes a state for reading as shown in FIG. 3e. In the state of FIG. 3b, a column conductor 28 is connected to the power source 33 for reverse-bias of the diode whereas the point 58 on a row conductor is connected to the power source for forward-bias of the diode and in addition, the capacitor 19 is discharged almost completely because of the storage of the photo-signal charge. As a result, the diode 25 tends to be forward-biased by way of no appreciable voltage drop. Thus, the power source 33 is required to have a high voltage $V_B$ which is sufficient to prevent the forward-bias of the diode. Since a forward voltage V applied across the diode is given by, $$V = \frac{Q_s - C_a(V_B - V_d)}{C_a + C_d} \quad (1)$$

where $Q_s$ is a stored photo-signal charge (coulomb), $C_a$ is a capacitance of the capacitor 19, $C_d$ is a capacitance of the diode 25, and $V_d$ is a voltage drop across the diode forward-biased, $$V_B > Q_s/C_a + V_d \quad (2)$$

must stand in order not to make the voltage V positive. In a photosensor using a photoelectric conversion film of amorphous silicon and having a reading width of 220 mm and 8 lines/mm resolution, the maximum value of Qs is about 1.7 pC, the capacitance of Ca is about 0.17 pF, Vd is 0.5 V when silicon diodes are used as diodes 25, and hence $V_B$ needs to be above 10.5 V. For reading signals, the point 58 is connected to the bias power source 20 and the point 59 is connected to an output line 24 as shown in FIG. 3e. Under this condition, since the power source 33 is coupled to the output line 24 via a parasitic capacitor 51, voltage on the output line 24 increases. As described previously, the increase in this voltage is considerably large as compared to the signal component, making it difficult to proceed with signal processing in the subsequent stage. To obviate this problem, a capacitor 51' and a power source 33' adapted to cancel out an increased voltage.

FIG. 3f shows a timing chart adapted, for simplicity of explanation, for driving the circuit of a 3 rows×4 columns matrix array. Pulse voltages $Y_1$ to $Y_3$ applied to row conductors have an L (low) level indicative of grounding level and a H (high) level indicative of the bias voltage 20 applied to the photodiode or the photoconductive film. Respective groups of unit picture elements connected to each of the row conductors are successively applied with the bias voltage 20. Column conductors 28 are applied with pulse voltages $X_1$ to $X_4$. These pulse voltages $X_1$ to $X_4$ scan sequentially within a time interval during which one of the pulse voltages $Y_1$ to $Y_3$ remains at the H level. The pulse voltages $X_1$ to $X_4$ have an L level established when the switch 32 is transferred to the power source 33 and a H level established when the switch 32 is transferred to the output line 24. Immediately after reading, the clear switch 36 is closed to reset the photodiode at timings as represented by a waveform CLR in FIG. 3f. A photodiode included in a unit picture element of 1st row and 2nd column is applied, at one end or the node 57, with a potential $V_{57}$. This potential shows that reading and resetting are carried out during a time interval of from $t_0$ to $t_1$, signals are stored during a time interval of from $t_1$ to $t_9$, and reading and resetting are again effected during a time interval of from $t_9$ to $t_{10}$. The potential $V_{57}$ takes partial waveforms 60 in the absence of input photo-signals and partial waveforms 61 in the presence of input photo signals whereby the potential $V_{57}$ gradually decreases owing to storage of photo-signal charge. Since the connection state of the photosensor changes every moment as shown in FIGS. 3a to 3e, the potential $V_{57}$ follows the change as shown in FIG. 3f. However, as far as the previous condition for $V_B$ is satisfied, electric charge stored at the node 57 is so affected only by photocurrent as to change. A waveform $V_{59}$ in FIG. 3f shows voltage at the point 59 which is read through a voltage read measure without resort to the resistor 40. Under this condition, an output voltage $V_{out}$ can be obtained.

Comparing the exemplary equivalent circuit configurations of FIGS. 2a and 2b, it will be seen that polarities of the blocking diode and the photodiode are reversed, and polarity of the power source $V_T$ is also reversed so that biasing of the photodiode is reversed. Obviously, if the positioned relationship between the blocking diode $D_B$ and the photodiode $D_p$ is reversed, the polarity of the power source 6 is simply reversed. The photosensor intended by the present invention incorporates a circuit as enclosed by a dotted line block in FIG. 2a or 2b.

Figure 4A:
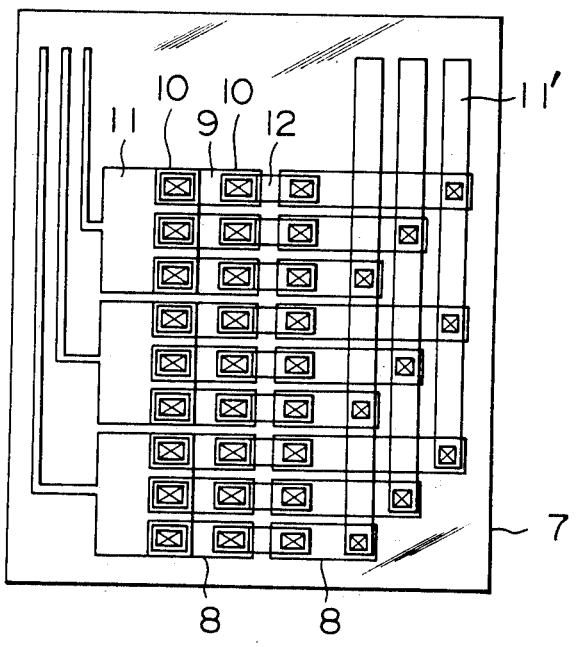
FIG. 4a is a plan view showing one embodiment of the photosensor according to the invention.
Figure 4B:
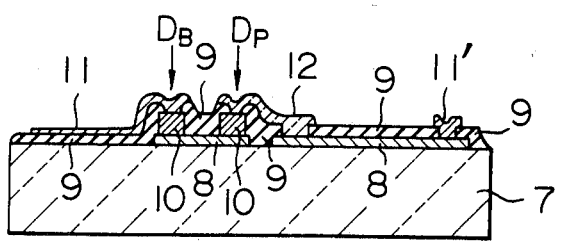

According to one embodiment of the invention, the photosensor circuit is materialized as schematically shown in FIGS. 4a and 4b, of which FIG. 4a is its plan view and FIG. 4b is its sectional view. Illustrated therein are an insulating substrate 7, stripe electrodes 8 made of metal films, insulating films 9, semiconductor films 10 for formation of diodes, metal films 11, 11' for formation of conductors, and transparent conductive films 12. While the blocking diode ($D_B$) is formed at a portion of the semiconductor film 10 sandwiched by the metal films 8 and 11, the photodiode ($D_p$) is formed at another portion of the semiconductor film 10 sandwiched by the metal film 8 and the transparent conductive film 12. Irradiation of light onto the blocking diode will increase reverse saturated current to a great extent and hence it must be avoided to the utmost. Thus, the metal film 11 also fills the role of light shield.

It is of the most significance in the present invention that a set of the photodiode and the blocking diode is formed of the same semiconductor material. With this construction, dispersion of the outputs from the unit picture elements can be minimized.

More particularly, assuming that the photodiode and the blocking diode have in operation capacitances of Ca and Cd, respectively, the output $V_{out}$ from the unit picture element is considered to be, $$V_{out} \propto \frac{C_d}{C_a + C_d}$$

Accordingly, if the capacitances $C_a$ and $C_d$ are uneven in the respective unit picture elements, uniformity of outputs from all the photosensors will be imparied seriously.

For example, the capacitance of a diode made of an amorphous silicon material becomes irregular within about 10% because of manufacture tolerance of the diode, raising a serious problem in materializing a practical photosensor of large size.

However, this problem can be solved by forming the photodiode and the blocking diode on the same semiconductor material as in the present invention. To be specific, even if film quality changes during the semiconductor film deposition process in the manufacture of the photosensors, the photodiode and the blocking diode in a photosensor formed on the same semiconductor material prepared through the same process will equally be affected by changes in film quality. As a result, their capacitances will equally be affected by the changes in film quality and characteristics of the respective unit picture elements in the photosensor can be made uniform.

An amorphous silicon film may advantageously be used as the semiconductor layer to this end. The amorphous silicon film is highly stable and in addition its deposition can be performed through well-known sputtering process or well-known plasma CVD (Chemical Vapor Deposition) process, thereby making it possible to materialize an elongated photosensor.

In the driving scheme of the present invention, the blocking diode is required to have extremely excellent rectifying properties. It has hitherto been considered that a diode of excellent rectifying properties is difficult to prepare with the amorphous semiconductor material. However, an amorphous silicon film has been proven to be suitable for preparation of a diode which can meet practical use. To this end, as well known in the art, amorphous silicon is doped with hydrogen or fluorine to terminate the trap level within the band gap. In this manner, a semiconductor film of better quality can be obtained. In particular, without artificial doping, hydrogen can naturally be doped into amorphous silicon during the manufacture process, for example, sputtering process in a circumstances containing hydrogen or CVD process. In use of hydrogenated amorphous silicon, 5 atomic % to 30 atomic % content of hydrogen is preferable. Ordinally, approximately 10 atomic % content is used. 50 atomic % content may be possible, however, it is particularly of no advantage.

The conductivity type of the amorphous silicon film is selected in a manner as applied to an ordinary silicon film wherein phosphorus or arsenic, for example, may be doped as donor impurity and boron, for example, may be doped as acceptor impurity.

It is also of significance that the electrode, excepting its portion for connection to the semiconductor film, is partly covered with the insulating film 9. The semiconductor film may have a multiple layer structure in which an n-type semiconductor layer in contact with the bottom metal film, an intrinsic semiconductor layer, and a p-type semiconductor layer are laminated in this order. The order of the lamination may be reversed. For a Schottky diode, the p-type semiconductor layer is not always necessary. The photodiode and the blocking diode used in the photosensor are dimensioned to be, for example, about 100 $\mu$m × 100 $\mu$m, and the unit picture elements comprised of the photodiode and blocking diode are arrayed at, for example, a pitch of 125 $\mu$m. Exemplified in FIG. 4a is a 3×3 matrix array for simplicity of illustration. The semiconductor film 10 has a width which is smaller than that of the metal film 8 as will be seen from FIG. 4a. By this, the semiconductor film 10 of a very small thickness, typically below 1 $\mu$m, can be prevented from extending beyond the width of the metal film 8 and forming on a shoulder at the edge of the metal film 8, which shoulder tends to cause cracks or micro cracks in the semiconductor film. By preventing the formation of cracks or micro cracks in the semiconductor film, characteristics of the diode can be improved. In FIG. 4b, light is irradiated onto the photodiode through the upper transparent conductive film 12. Alternatively, a portion of the metal film 8 in contact with the photodiode may be replaced by a transparent conductive film and light may be irradiated through the glass substrate 7.

EXAMPLE 1

Figure 5:
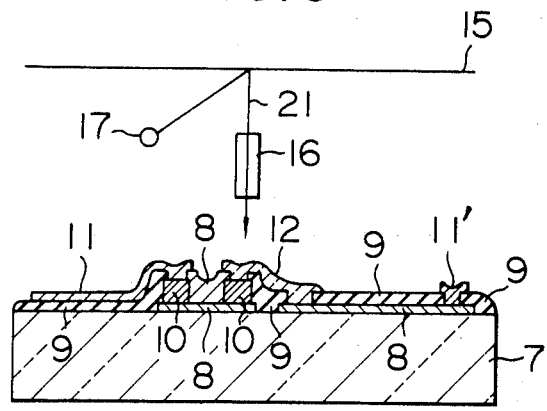

In connection with the structure as shown in FIG. 4a, a chromium film is vapor deposited (or sputtered) on the entire surface of a glass substrate 7 at a substrate temperature of 200° C. to a thickness of 0.2 $\mu$m. Thereafter, a metal film 8 is patterned through photo-etching process as shown in the plan view of FIG. 4a. Used as etchant is a ceric ammonium nitride solution. Subsequently, a silicon film 10 is formed on the entire surface of the metal film 8 through plasma chemical vapor deposition process well known in the art. For formation of the silicon film 10, an n-type amorphous silicon film of 40 nm thickness, an intrinsic silicon film of 0.6 $\mu$m and a p-type amorphous silicon film of 20 nm are laminated in this order. Conditions for the formation of the silicon film 10 are as follows. For formation of the n-type amorphous silicon film, the so-called plasma chemical vapor deposition process is used wherein a gas containing $PH_3$ and $SiH_4$ at a volume ratio of 0.1 to 10% is diluted with $H_2$ to about 10%, and the resultant gas is subjected to radio frequency discharge decomposition and deposited on the substrate. During this process, the substrate temperature is maintained at 150° to 300° C. A gas containing $AsH_3$ and $SiH_4$ at a volume ratio of 10 to 1000 ppm may also be used for the formation of the N-type semiconductor film. The intrinsic semiconductor film is formed through plasma chemical vapor deposition process using a gas resulting from dilution of $SiH_4$ gas with $H_2$ to about 4 to 100%. The p-type amorphous silicon film is formed through plasma chemical vapor deposition using a gas resulting from dilution of a gas containing $B_2H_6$ gas and $SiH_4$ gas at a volume ratio of 0.1 to 10% with $H_2$ to about 10%. A mixture gas of $SiH_4$ and $SiF_4$ may substitute for $SiH_4$. For dilution, Ar gas may also be used. In order to pattern the thus prepared semiconductor film as shown in FIGS. 4a and 4b, a photoresist mask of the corresponding pattern is applied on the semiconductor film and this film is subjected to plasma-etching using $CF_4$ gas to remove an unnecessary portion of amorphous silicon. Thereafter, the photoresist mask is removed and a semiconductor film 10 is obtained. Subsequently, 7059 glass (trademark of CORNING PRODUCTS) is deposited by sputtering on the entire surface of the semiconductor film to a thickness of 1 $\mu$m or more to form a glass insulating film 9. Contact holes are formed in the insulating film 9 as shown in the Figure through photo-etching process using a hydrofluoric acid (HF) type etchant. In addition to 7059 glass, another insulating material of SiO, $SiO_2$ or organic high polymeric resin (for example, polyimide resin) may of course be used. Subsequently, indium oxide is deposited by sputtering to a thickness of 0.2 $\mu$m and the resultant film is etched through photo-etching process to form a transparent conductive film 12. Etchant in this process is of a hydrochloric acid type. Indium tin oxide may be replaced by $SnO_2$. The thus prepared transparent conductive film of indium tin oxide is protected by a photoresist film formed thereon. Finally, aluminum is vapor deposited to a thickness of about 1 μm and the resultant film is etched to form an electrode 11, and conductive layer 11′ through photo-etching using an etchant of a kalium terricyanide ($K_3[Fe(CN)_6]$) type or a nitric acid type, thus completing a photosensor. Obviously, chromium for the metal film 8 in this Example may be replaced by Ta, NiCr, Mo, W, Al, Pt or Pd, and aluminum for the electrode 11 may be replaced by Cr, Ta, NiCr, Cu, CrCu, Ni, Cr, Au, Mo, W, Pt or Pd. In this photosensor, light 21 focused by a SELFOC lens 16 is irradiated on the photodiode array from above, as shown in FIG. 5. It is understood that the substrate 7 is not required to be transparent. Also illustrated in FIG. 5 are an original 15 and a light source for illumination 17. Since the distance between the photosensor and the original is very small, below 4 cm, and light utilization efficiency is high, a fluorescent lamp, a light-emitting-diode array, a plasma discharge tube or an electro luminescence device may be used as the illumination light source. In FIG. 5, the same elements as those in FIG. 4b are designated by the same reference numerals. The order of lamination of the n-type layer, i-type layer and p-type layer may be reversed. When the electrode 11 is made of a material of Au, Pd or Pt, a Schottky barrier is set up between this metal material and the i-type layer to form a Schottky diode so that the p-type layer is not always necessary.

EXAMPLE 2

Figure 6:
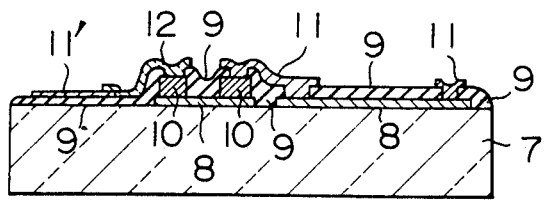

In this Example, the positional relationship between the blocking diode and the photodiode in the photosensor of Example 1 is reversed as shown in FIG. 6. A photosensor of Example 2 has the same structure as that of FIGS. 4a and 4b with the only exception that the position of a transparent conductive film 12 of indium tin oxide is changed, and can be prepared through the same process as Example 1, which process is not described herein.

EXAMPLE 3

Figure 7:
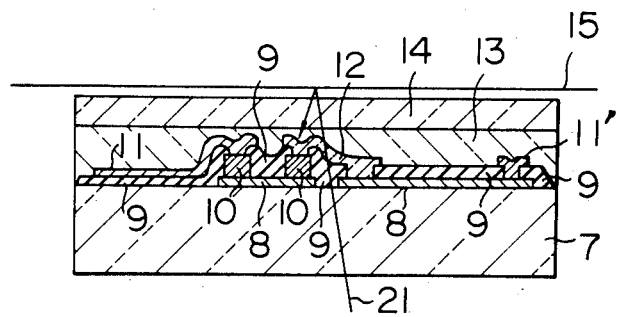

With reference to FIG. 7, a transparent micro sheet of glass is bonded with an adhesive 13 to the top of the photosensor (see FIG. 4b) manufactured in accordance with Example 1. In FIG. 7, the same elements as those of FIGS. 4a and 4b are designated by the same reference numerals. The glass micro sheet has preferably a thickness of 200 μm or less. Ultraviolet ray hardenable resin or epoxy type resion is used as the adhesive 13. In this photosensor, light 21 is irradiated through a glass substrate 7 as shown at an arrow in FIG. 7. This photosensor can assure reading of an original without resort to a lens. In place of the glass micro sheet bonded to the pre-fabricated photosensor, a transparent insulator film may be used which is formed on the entire top surface of the photosensor of Example 1 by sputtering $SiO_2$, 7059 glass or SiO to a thickness of about 200 μm. Teachings of this Example may be applied to the photosensor of Example 2.

EXAMPLE 4

Figure 8:
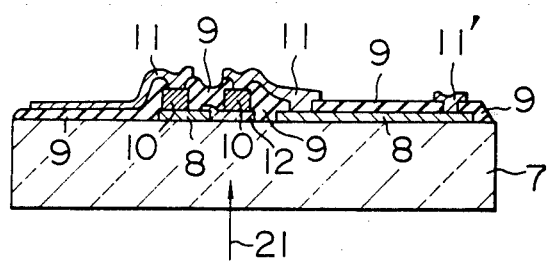

A sectional structure of this Example is shown in FIG. 8. Chromium is deposited on a glass substrate 7 by sputtering to a thickness of 0.2 μm and the resultant film is patterned through photo-etching process to form a electrode 8. Thereafter, indium tin oxide is deposited by sputtering and the resultant film is patterned through photo-etching process to form an electrode 12. Subsequently, an amorphous silicon film is formed in the same manner as described in Example 1 and is then subjected to plasma asher to form a semiconductor film 10. Next, 7059 glass is deposited by sputtering to a thickness of 2 μm and is then pattern thorugh photo-etching process to form an insulating film 9. Finally, aluminum is vapor deposited to a thickness of 1 μm and is then patterned through photo-etching process to form an aluminum electrode 11, thus completing a photosensor. In this photosensor, light 21 is irradiated by way of the transparent electrode 12 as shown at an arrow in FIG. 8. Obviously, the transparent electrode 12 positioned below the photodiode in this Example may be shifted to below the blocking diode, provided that the positional relationship between the photodiode and the blocking diode is reversed.

EXAMPLE 5

In the photosensor according to the invention, irradiation of light onto the blocking diode must be avoided to the utmost.

Figure 9:
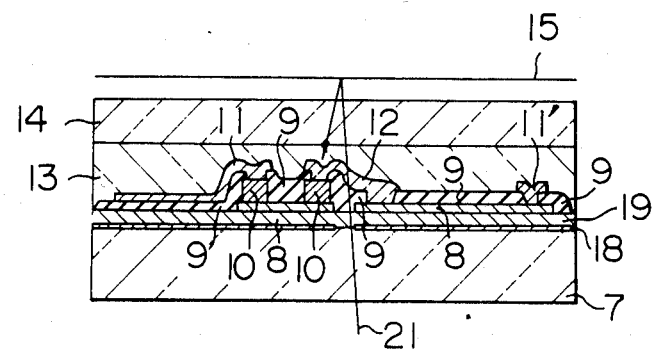

This Example is improved especially in this respect. With reference to FIG. 9, chromium is deposited by sputtering on a glass substrate 7 to a thickness of 0.2 μm and the resultant film is partly etched off near the photodiode as shown in FIG. 9. Thereafter, $SiO_2$ is deposited by sputtering to a thickness of 2 μm to form an insulating film 19. Subsequently, on the thus prepared base is formed a pre-fabricated photosensor identical to the photosensor of Example 3, thus completing a photosensor which can advantageously prevent irradiation of light onto the blocking diode.

Obviously, teachings of this Example may be applied to the photosensor of Example 2.

EXAMPLE 6

Figure 10:
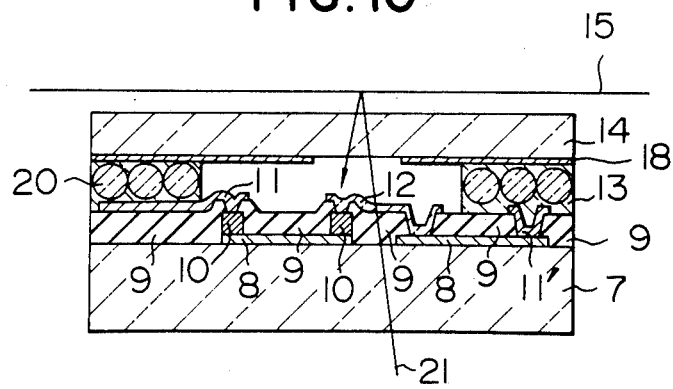

With refrence to FIG. 10, a photosensor of this Example has the same structure as that of Example 3 and can be prepared in the same manner. A chromium film is formed on a glass thin plate 14 and partly removed near the photodiode through photo-etching process to form a light shielding film 18 as shown in FIG. 10. The glass thin plate 14 is bonded with an adhesive 13 to a sensor section. The adhesive 13 is mixed with transparent insulating glass balls (of 50 μm diameter) 20 acting as a spacer is applied to an area exclusive of the diode.

In the photosensor of this Example, light 21 directed through a glass substrate 7 is reflected at an original 15 and irradiated on the photodiode. The diameter of the spacer, which is 50 μm in this Example, may be 5 μm or more, provided that the sum of thicknesses of the spacer and the thin glass plate is 200 μm or less.

In FIGS. 8 to 10, the same elements as those of FIGS. 4a and 4b are designated by the same reference numerals.

As has been described, according to the invention, the number of necessary switches, which is convertionally 1680 in a photosensor for reading an original of A4 size (210 mm width) using photodiodes of a population of 8/mm, for example to constitute an array of $210 \times 8 = 1680$ photodiodes, can be minimized the same type of photosensor to 86 by employing a matrix drive scheme of $30 \times 56$, for example, thereby providing an inexpensive photosensor. The photosensor of this invention is easy to operate as having ability to read the original with a SELFOC lens or without resort to a conventional optical lens when it is merely in close contact with the original and being freed from any sophisticated optical adjustment, and it can contribute to reduction of the thickness of apparatus.

We claim:

1. A photo electro transducer device including:
   a plurality of first wiring conductors formed on an insulating substrate in the form of a one-dimensional array;
   a plurality of photo electro transducing elements respectively formed on each of said first wiring conductors;
   a plurality of second wiring conductors for dividing said photo electro transducing elements into at least two groups each having equal numbers of photo electro transducing elements and for electrically connecting one end of each of said transducing elements belonging to each group with each other, said second wiring conductors being the same in number as the number of said groups;
   a first bias voltage source;
   a first electric circuit for electrically connecting a predetermined one of said second wiring conductors to said first bias voltage source to select a predetermined one of said groups of photo electro transducing elements and for electrically connecting the remaining ones of said second wiring conductors to a grounding point;
   a plurality of third wiring conductors for electrically connecting the other end of each of said photo electro transducing elements located in the same respective position in each of said groups with each other, said third wiring conductors being the same in number as the number of said transducing elements belonging to each group;
   a second bias voltage source; and
   a second electric circuit for electrically connecting a selected one of said third wiring conductors connected to photo electro transducing elements of said selected group of said photo electro transducing elements to a read circuit and for electrically connecting the remaining ones of said third wiring conductors to said second bias voltage source;
   wherein said first, second and third wiring conductors are formed on said insulating substrate, and
   wherein each of said photo electro transducing elements has two semiconductor layers formed on said first wiring conductors and separated from each other, one of said semiconductor layers being provided between said first and second wiring conductors to form a blocking diode and the other semiconductor layer being provided between said first and third wiring conductors to form a photo diode.

2. A photo electro transducer device according to claim 1, wherein said semiconductor layers each include an amorphous silicon layer.

3. A photo electro transducer device according to claim 1 or 2, wherein said insulating substrate is transparent.

4. A photo electro transducer device according to claim 1 or 2, wherein a side surface and an upper surface of each of said semiconductor layers is partially covered with an insulating film.

5. A photo electro transducer device according to claim 1, wherein said second wiring conductor is located to cover said semiconductor layer which forms a blocking diode to provide a a light shielding layer for said blocking diode.

6. A photo electro transducer device according to claim 1, wherein said insulating substrate includes a transparent insulating substrate, a portion of said first wiring conductor includes a transparent wiring conductor, and said photo electro transducing element is arranged such that the photodiode is disposed on said transparent wiring conductor.

7. A photo electro transducer device according to claim 1, further comprising a transparent insulating plate formed on a side of said insulating substrate on which said photo electro transducing elements are arranged.

8. A photo electro transducer device according to claim 1, 2 or 7, wherein said substrate has a light shielding layer on a surface of said substrate.

9. A photo electro transducer device according to claim 1, wherein said third wiring layer is formed to have a first layer of conductor material and a second layer of insulator material.

10. A photo electro transducer device according to claim 1 or 9, wherein said third wiring layer is coupled to said semiconductor layer forming said photo diode through a transparent conductive film which is formed to cover said photo diode.

11. A photo electro transducer device according to claim 1, wherein said two semiconductor layers are simultaneously formed on said first wiring conductors by the same process.

12. A photo electro transducer device according to claim 4, wherein said third wiring layer is formed to have a first layer of conductor material and a second layer of insulator material, and wherein said insulating film covering said semiconductor layers and said second layer of insulator material are formed by the same process.

13. A device according to claim 1, wherein said semiconductor layers forming said blocking diode and said photo diode are formed to be only on said first wiring conductor with no portions thereof coming into direct contact with said insulating substrate.

14. A device according to claim 1, wherein said semiconductor layers forming said blocking diode and said photo diode are separated from one another by an insulating layer formed to cover an area of said first wiring conductor interposed between said semiconductor layers and to completely cover sides of said semiconductor layers which face each other.

15. A device according to claim 13, wherein said semiconductor layers forming said blocking diode and said photo diode are separated from one another by an insulating layer formed to cover an area of said first wiring conductor interposed between said semiconductor layers and to completely cover sides of said semiconductor layers which face each other.

16. A device according to claim 2, wherein said blocking diode and said photo diode formed to include amorphous silicon layers are constructed to have a PIN structure.

* * * * *